(12) United States Patent
Jagannathan et al.

(10) Patent No.: US 9,627,510 B1
(45) Date of Patent: Apr. 18, 2017

(54) STRUCTURE AND METHOD FOR REPLACEMENT GATE INTEGRATION WITH SELF-ALIGNED CONTACTS

(71) Applicant: International Business Machines Corporation, Armonk, NY (US)

(72) Inventors: Hemanth Jagannathan, Niskayuna, NY (US); Sivananda K. Kanakasabapathy, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/956,602

(22) Filed: Dec. 2, 2015

(51) Int. Cl.
| | |
|---|---|
| H01L 29/66 | (2006.01) |
| H01L 29/49 | (2006.01) |
| H01L 29/423 | (2006.01) |
| H01L 29/78 | (2006.01) |
| H01L 29/06 | (2006.01) |
| H01L 29/417 | (2006.01) |
| H01L 21/283 | (2006.01) |

(52) U.S. Cl.
CPC ...... H01L 29/66545 (2013.01); H01L 21/283 (2013.01); H01L 29/0649 (2013.01); H01L 29/4175 (2013.01); H01L 29/4238 (2013.01); H01L 29/49 (2013.01); H01L 29/66553 (2013.01); H01L 29/78 (2013.01)

(58) Field of Classification Search
CPC ..................... H01L 29/66545; H01L 29/6656
See application file for complete search history.

(56) References Cited

U.S. PATENT DOCUMENTS

| | | | |
|---|---|---|---|
| 7,078,282 | B2 | 7/2006 | Chau et al. |
| 7,135,724 | B2 | 11/2006 | Chen et al. |
| 7,157,777 | B2 | 1/2007 | Tsuchiaki et al. |
| 7,361,958 | B2 | 4/2008 | Brask et al. |
| 7,544,610 | B2 | 6/2009 | Cabral, Jr. et al. |
| 7,867,863 | B2 | 1/2011 | Chang |
| 2011/0156107 | A1 | 6/2011 | Bohr et al. |
| 2012/0018816 | A1 | 1/2012 | Sen et al. |
| 2012/0032275 | A1 | 2/2012 | Haran et al. |

(Continued)

OTHER PUBLICATIONS

K. J. Kuhn, CMOS transistor scaling past 32nm and implications on variation, 2010 IEEE/SEMI Advanced Semiconductor Manufacturing Conference (ASMC), IEEE/SEMI, Jul. 11-13, 2010, pp. 241-246.

*Primary Examiner* — Thomas L Dickey
(74) *Attorney, Agent, or Firm* — Harrington & Smith

(57) ABSTRACT

A method for fabricating a semiconductor device comprises forming a dummy gate on a substrate; forming spacers at opposing sides of the dummy gate; depositing a sacrificial interlayer dielectric over the dummy gate; planarizing the interlayer dielectric to expose the dummy gate; removing the dummy gate; forming a replacement metal gate with a protective cap between the spacers and on the substrate to replace the removed dummy gate; removing the sacrificial interlayer dielectric; siliciding exposed areas of the substrate adjacent to the replacement metal gate; depositing a final interlayer dielectric over the replacement metal gate and the exposed silicided areas; and forming vias through the final interlayer dielectric to the silicided areas.

13 Claims, 9 Drawing Sheets

(56) References Cited

U.S. PATENT DOCUMENTS

2013/0049132 A1\* 2/2013 Doris .................. H01L 21/7682
                                                                                                                              257/383

2013/0078791 A1\* 3/2013 Xie .................... H01L 21/28088
                                                                                                                             438/586

\* cited by examiner

US 9,627,510 B1

STRUCTURE AND METHOD FOR REPLACEMENT GATE INTEGRATION WITH SELF-ALIGNED CONTACTS

BACKGROUND

The exemplary embodiments of this invention relate generally to semiconductor devices and, more specifically, to structures and methods relating to self-aligned contacts with replacement metal gates to inhibit or at least reduce contact resistance variation between semiconductor devices.

In the manufacture of an integrated circuit (IC) chip, various semiconductor devices (e.g., field effect transistors such as metal oxide semiconductor field effect transistors (MOSFETs)) can be fabricated on a supporting substrate using various deposition techniques. Current flows within a semiconductor device from a source to a drain. A gate generates an electric field that controls the current flow. Precise alignment of the connections or contacts to the semiconductor device with regard to the source, drain, and gate is not always possible, particularly as trends in semiconductor fabrication progress toward further size reduction.

As further size reduction leads to shrinking dimensions in gate length, it should be realized that there is also limited space in which to land contacts in the source and drain regions of a semiconductor device. This leads to a desire to utilize a self-aligned contact (SAC) configuration. In a SAC configuration used with a MOSFET, for example, the gate is engineered such that source/drain contacts land in their intended places so as not to result in a shorted device or otherwise interfere with the operation of the device. However, in a SAC configuration, when such a contact moves over a spacer and gate of a device (due to overlay and alignment variability in the fabrication process), the area of active contact between the SAC and the source/drain region changes. This can result in variations in the contact resistance of the semiconductor device both within and from wafer to wafer and can affect the net drive current that can be expected from the device. Such large variations in contact resistances between devices are generally not tolerable.

BRIEF SUMMARY

In one exemplary aspect, an apparatus comprises a semiconductor device located on a substrate, the semiconductor device having a replacement metal gate and a first set of spacers adjacent to the replacement metal gate and on opposing sides of the replacement metal gate; at least one silicided area on the substrate and adjacent to at least one of the spacers of the first set of spacers; and a self-aligned contact disposed over the replacement metal gate of the semiconductor device and in contact with the silicided area. The at least one silicided area does not underlap the at least one spacer of the first set of spacers.

In another exemplary aspect, a method for fabricating a semiconductor device comprises forming a dummy gate on a substrate; forming spacers at opposing sides of the dummy gate; depositing a sacrificial interlayer dielectric over the dummy gate and the substrate; planarizing the interlayer dielectric to expose the dummy gate; removing the dummy gate; forming a replacement metal gate with a protective cap between the spacers and on the substrate to replace the removed dummy gate; removing the sacrificial interlayer dielectric; siliciding exposed areas of the substrate adjacent to the replacement metal gate; depositing a final interlayer dielectric over the replacement metal gate and the exposed silicided areas; and forming vias through the final interlayer dielectric to contact the silicided areas.

In another exemplary aspect, a method of forming a module for a self-aligned contact for a semiconductor device comprises sealing a dummy gate formed on a substrate by depositing a sacrificial interlayer dielectric over the dummy gate and the substrate; planarizing to reveal the dummy gate; replacing the dummy gate with a replacement metal gate with a protective cap; removing the sacrificial interlayer dielectric; siliciding areas of the substrate adjacent to the replacement metal gate; depositing a final interlayer dielectric over the silicided areas; and forming vias through the final interlayer dielectric to the silicided areas.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

The exemplary embodiments described herein are directed to structures and methods pertaining to the integration of a self-aligned contact (SAC) module with a replacement metal gate (RMG) to inhibit or at least reduce variation in contact resistance between semiconductor devices. In doing so, the structures and methods may employ a sacrificial interlayer dielectric (ILD) material during a formation of a dummy gate and during removal of the dummy gate and RMG stack formation. Once the formed RMG is encapsulated, the sacrificial ILD material is removed, and the exposed active region of the semiconductor device (other than the gate region and the spacer region already formed) is silicided using a self-aligned silicidation (salicidation) process. A final ILD material is then deposited and planarized, and SAC via formation is then performed followed by metallization. In doing so, since the active area excluding the gate region is silicided, the contact resistance between semiconductor devices along with contact resistance variation from device to device may be markedly reduced.

Figure 1:
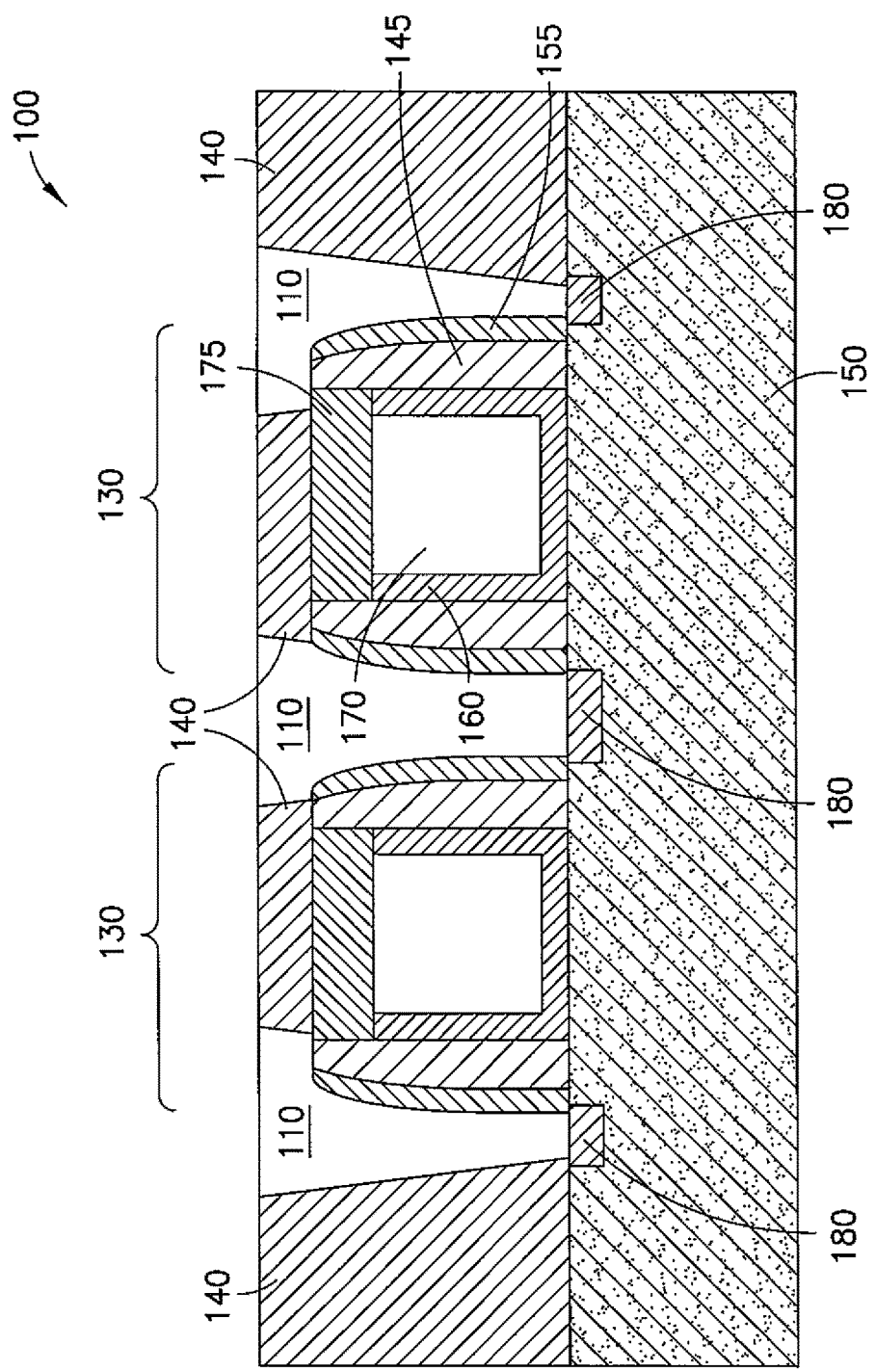
FIG. 1 is a schematic representation of a configuration in which self-aligned contacts are used to engage source/drain regions over replacement metal gates of a semiconductor device.

As shown in FIG. 1, a device in which self-aligned (borderless) contacts are used to engage source/drain regions is shown generally at 100 and is hereinafter referred to as "device 100." Device 100 comprises two gates arranged to have a contact pitch on a substrate 150 (e.g., a silicon substrate). Each gate is formed from a polysilicon dummy gate, which is enclosed on opposing sides thereof by a first set of spacers 145, which are in turn enclosed by a second set of spacers 155. The polysilicon dummy gate is then replaced with a metal gate 130. In the metal gate 130, a work function metal 160 is deposited on at least the lower facing surfaces of the spacers 145 of the first set (with regard to each RMG being formed) as well as on the bottom surface of the opening (the substrate 150) defined by the spacers 145. A fill metal 170 is deposited on the work function metal 160, and a cap 175 is disposed on edges of the work function metal 160 and the fill metal 170. The gates 130 are sealed with dielectric material 140 to prevent short circuits between self-aligned contacts (SAC) 110 and a printed circuit on the substrate 150 on which the gates 130 are located. However, the sealing of the gates 130 with the dielectric material 140 detracts from salicidation of the exposed regions at areas 180 during fabrication of the device 100 and further causes an increase in gate sheet resistance. More specifically, self-aligned silicidation of the substrate 150 depends on the overlap of the SAC 110 with spacers 145, 155 on the gates 130. More overlap with the spacers 145, 155 results in less silicon contact and higher contact resistance.

Additionally, depending on the degree of misalignment of the SAC 110 relative to the underlying silicided areas 180, the amount of contact between the SAC 110 and the silicided areas 180 may vary, thus inducing variation in the contact resistance of the device 100.

Referring now to FIGS. 2-5, one exemplary embodiment of a proposed process flow for forming a device in the form of a SAC module 200 is shown. To avoid the dielectric sealing of the gate and having to carry out subsequent silicidation through a dielectric layer, thereby resulting in reduction of the gate sheet resistance, RMGs are proposed for use in the SAC module 200.

Figure 2:
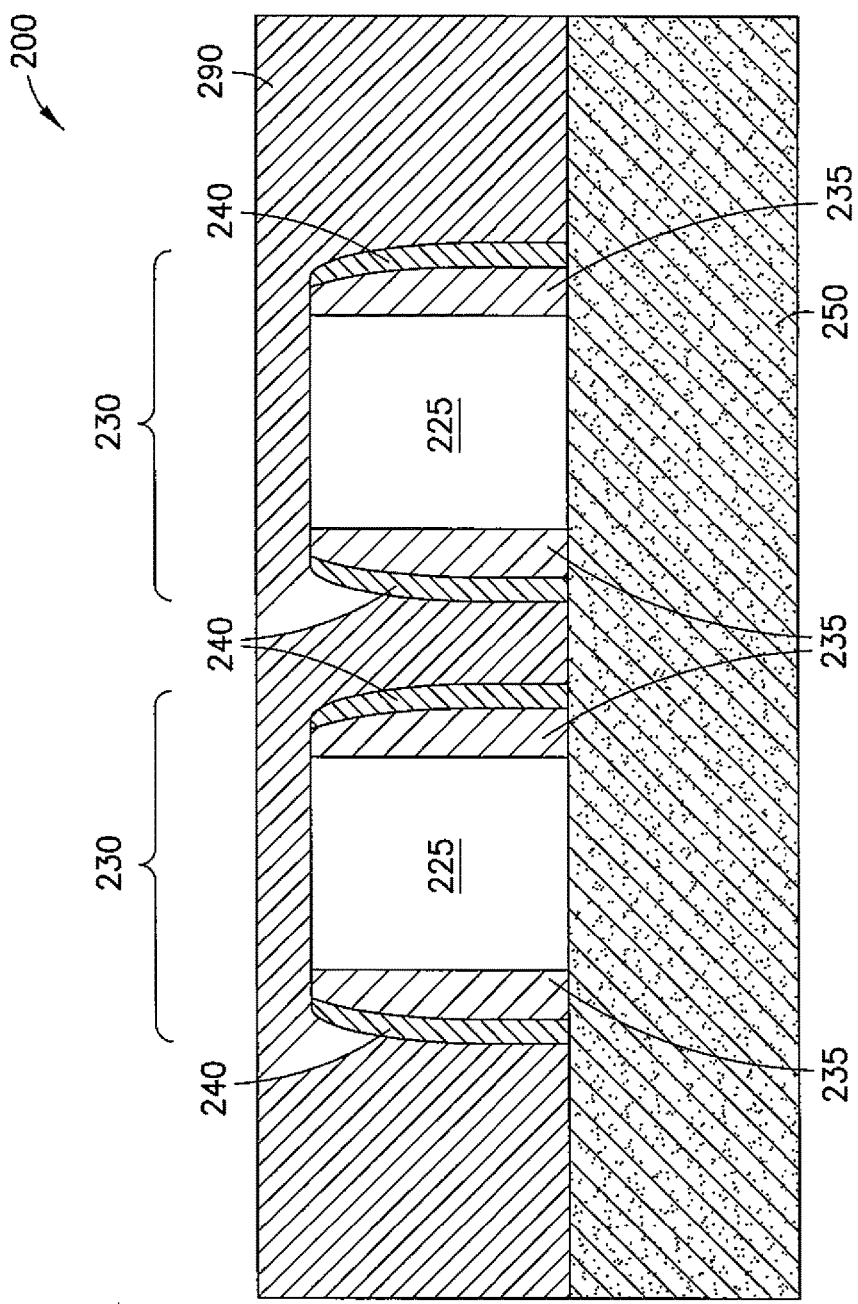
FIGS. 2-7 are schematic representations of an exemplary embodiment of a proposed process flow for forming a semiconductor device integrating self-aligned contacts with a replacement metal gate.

As shown in FIG. 2, a dummy gate 225 (fabricated of, for example, polysilicon) is formed on a substrate 250 (e.g., a silicon substrate, which may be an extremely thin silicon-on-insulator substrate). A first set of spacers 235 is formed on opposing sides of the dummy gate 225 to provide structure for forming the RMG. A second set of spacers 240 may be formed against the first set of spacers 235 to protect the first set of spacers 235 during subsequent etching processes. The second set of spacers 240 is optional depending upon the material used to form the first set of spacers 235. Materials from which the spacers are formed may be any dielectric material including, but not limited to, SiN, $Si_3N_4$, $SiO_2$, silicon carbon nitride, and the like. Source/drain regions (or raised source/drain regions) may then be formed in or on the substrate 250 adjacent to the dummy gate. A sacrificial interlayer dielectric (ILD) 290 is deposited on the dummy gates 230 and the substrate 250.

Figure 3:
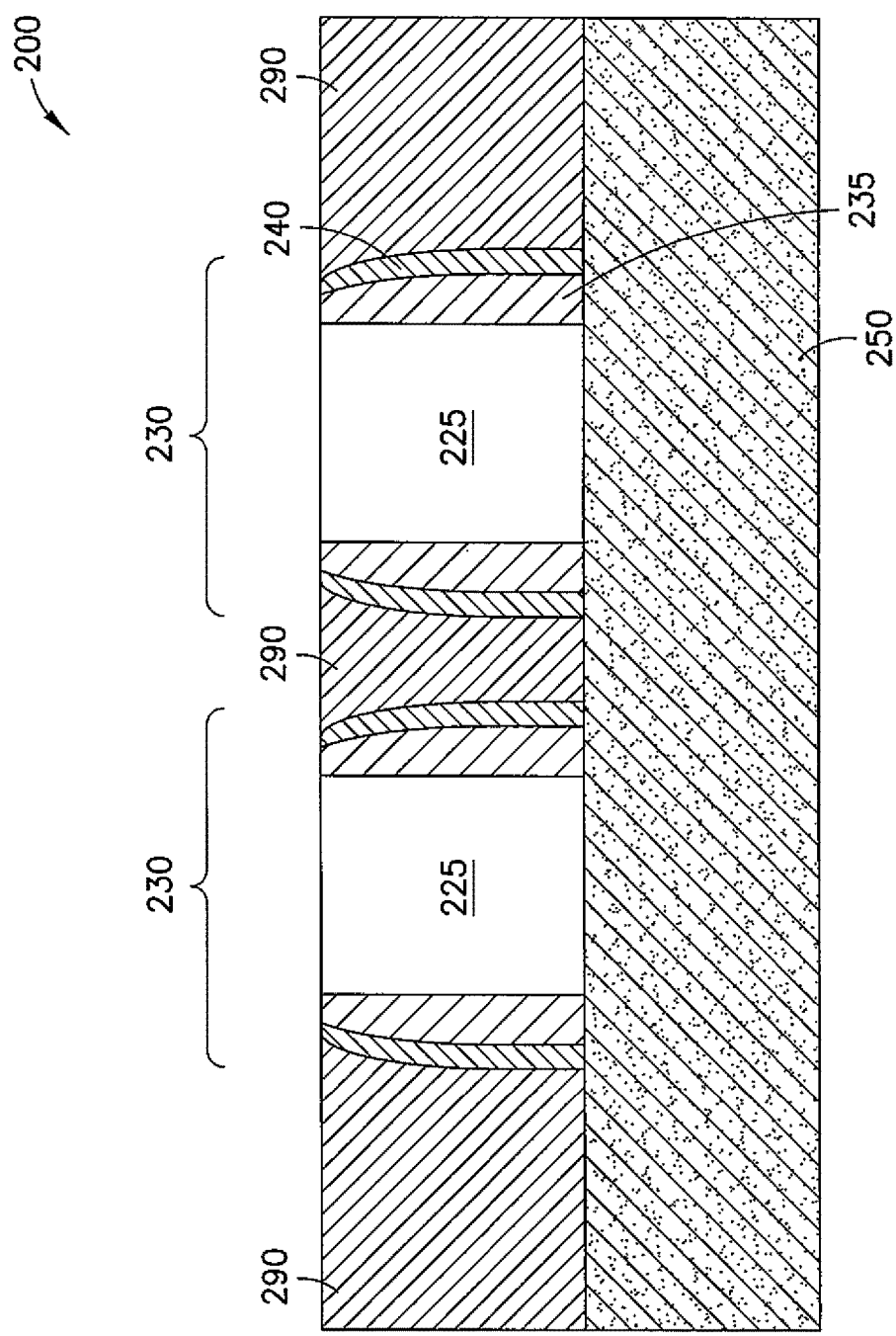

As shown in FIG. 3, the sacrificial ILD 290 is planarized (e.g., using a chemical mechanical polish (CMP)) to expose upper surfaces of the dummy gates 225.

Figure 4:
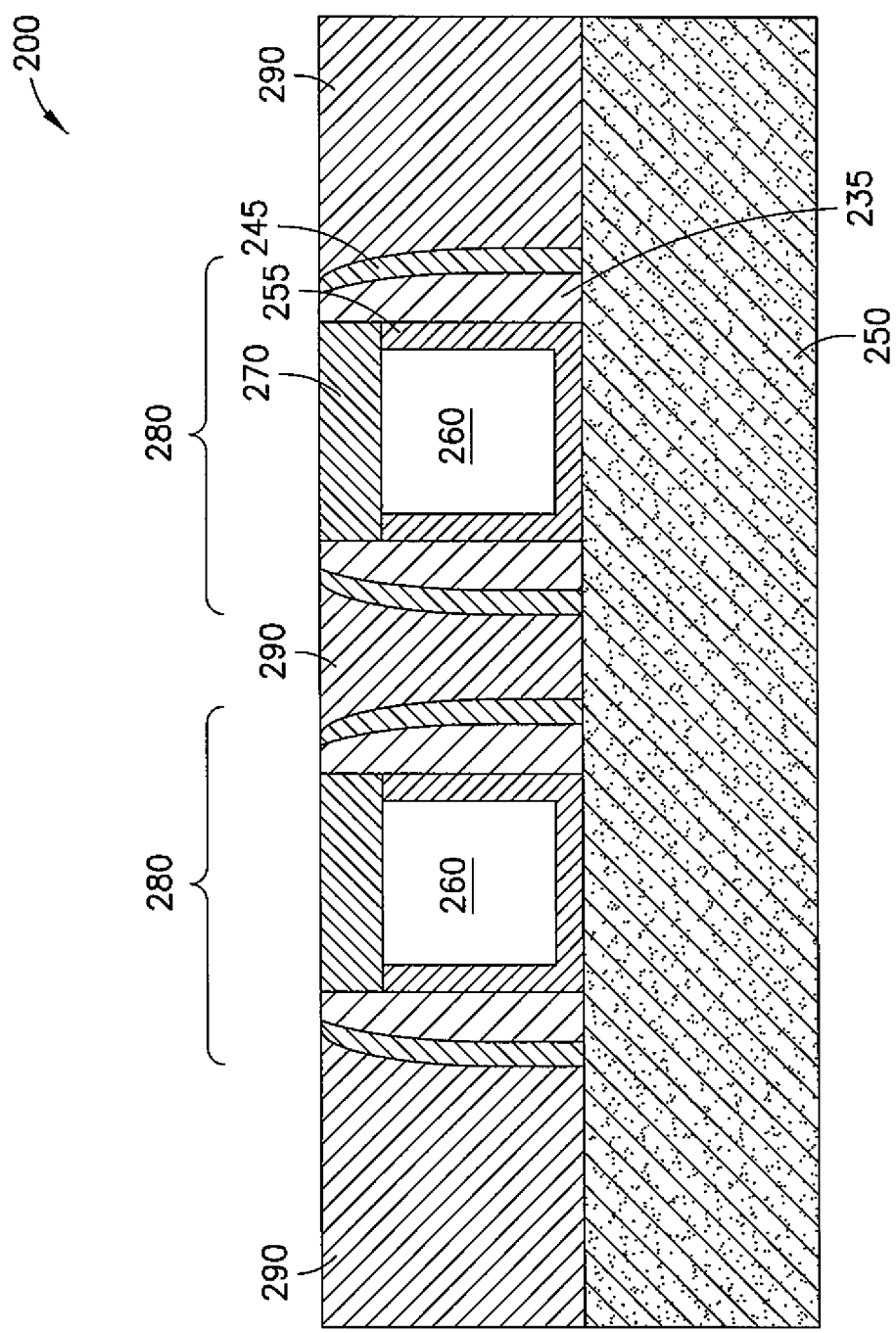

As shown in FIG. 4, the dummy gate 225 is removed using, for example, a combination of a dry etch process (e.g., a reactive ion etch (RIE), plasma etching, or the like) and a wet etch process (e.g., an acid such as phosphoric acid ($H_3PO_4$)). Upon removal of the dummy gate 225, the first set of spacers 235 and the second set of spacers 240 (if present) remain on the substrate 250. A gate dielectric and work function metal stack 255 is deposited on at least the lower facing surfaces of the spacers 235 of the first set (with regard to each RMG being formed) as well as on the bottom surface of the opening (the substrate 250) defined by the spacers 235. The gate dielectric may be $SiO_2$ or dielectrics with higher dielectric constant than $SiO_2$. The work function metal may be titanium, titanium nitride, tantalum, tantalum nitride, ruthenium, alloys of any of the foregoing materials, or the like. The gate dielectric and work function metal may be deposited by any suitable technique such as, for example, chemical vapor deposition (CVD), physical vapor deposition (PVD), or atomic layer deposition (ALD).

A fill metal 260 is deposited to fill the opening defined by the work function metal 255 on the spacers 235 and on the substrate 250. The fill metal 260 may be aluminum, although other metals such as Tungsten, Cobalt, Copper, nickel, tantalum, tantalum nitride, titanium, titanium nitride, TiAl alloy, ruthenium, tungsten, combinations of the foregoing materials, and the like may be used. The fill metal 260 is deposited via any suitable process including, but not limited to, CVD, PVD, or ALD.

A cap 270 is deposited on the fill metal 260 and the edges of the work function metal 255 to form an RMG 280. The material of the cap 270 may fill any remaining opening between the spacers 235. The material of the cap 270 may be aluminum, although other materials such as silicon nitride (SiN or $Si_3N_4$) may also or alternatively be used.

A sacrificial ILD 290 is deposited over the RMG 280 and the substrate 250 to seal the gate areas, and a chemical mechanical polish (CMP) is performed on the RMG 280 and the upper surface of the sacrificial ILD 290. The sacrificial ILD 290 may be deposited using any suitable deposition technique, such as CVD or ALD.

Figure 5:
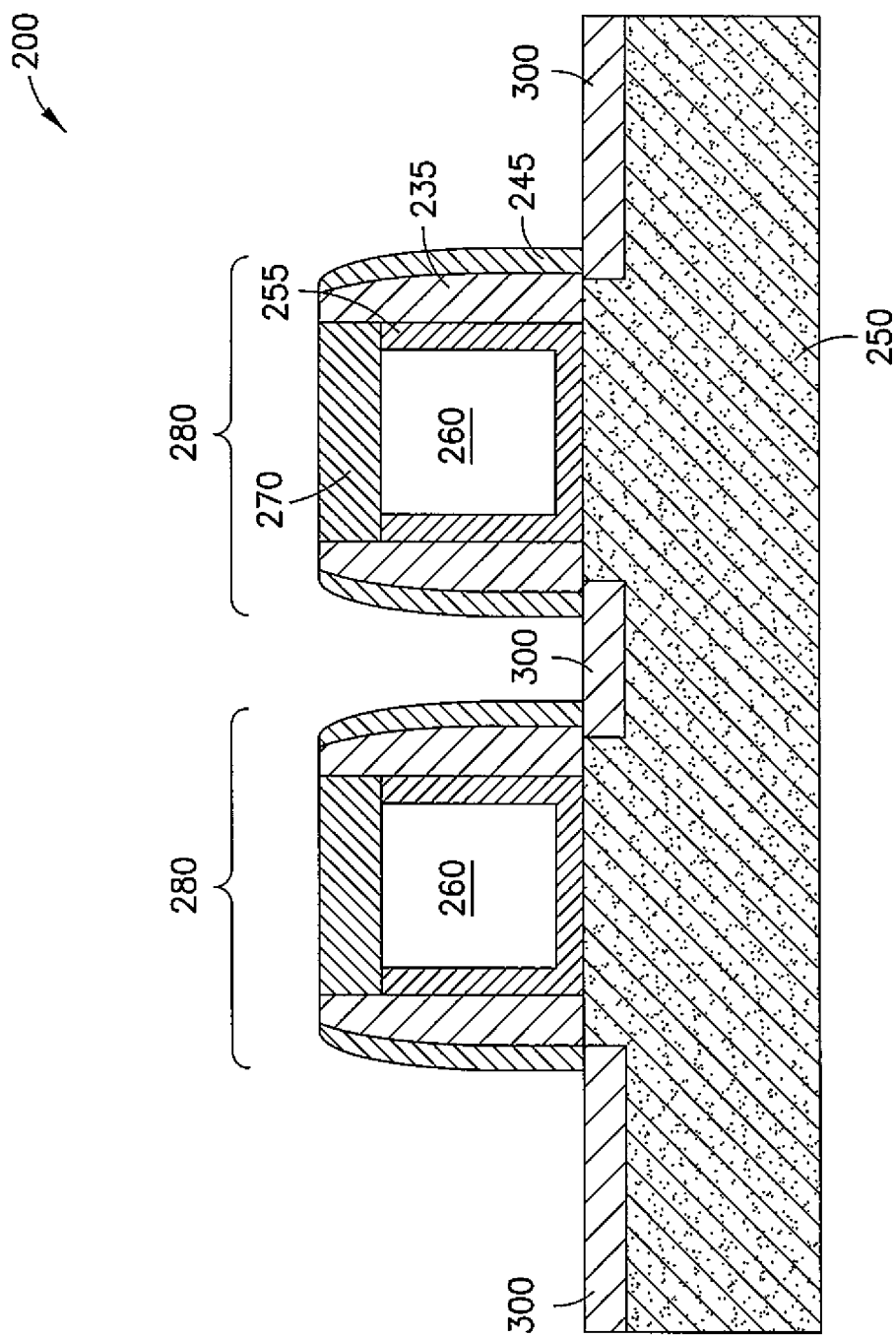

As shown in FIG. 5, the sacrificial ILD 290 is removed via any suitable stripping process such as, for example, a dry etch process (e.g., RIE), a wet etch process (e.g., HF), or a combination of dry etch and wet etch processes.

At least portions of the substrate 250 (e.g., the active silicon) exposed adjacent to the RMG 280 are silicided using the self-aligned silicidation process to form silicided areas 300. In embodiments in which two or more RMGs 280 are formed on the substrate 250, the exposed areas of the substrate 250 between the RMGs 280 are also silicided. Silicidation may be carried out, for example, by e-beam vaporization of a metal. Metals used to form the silicided areas 300 include cobalt, nickel, platinum, titanium, combinations of the foregoing, and the like.

Figure 6:
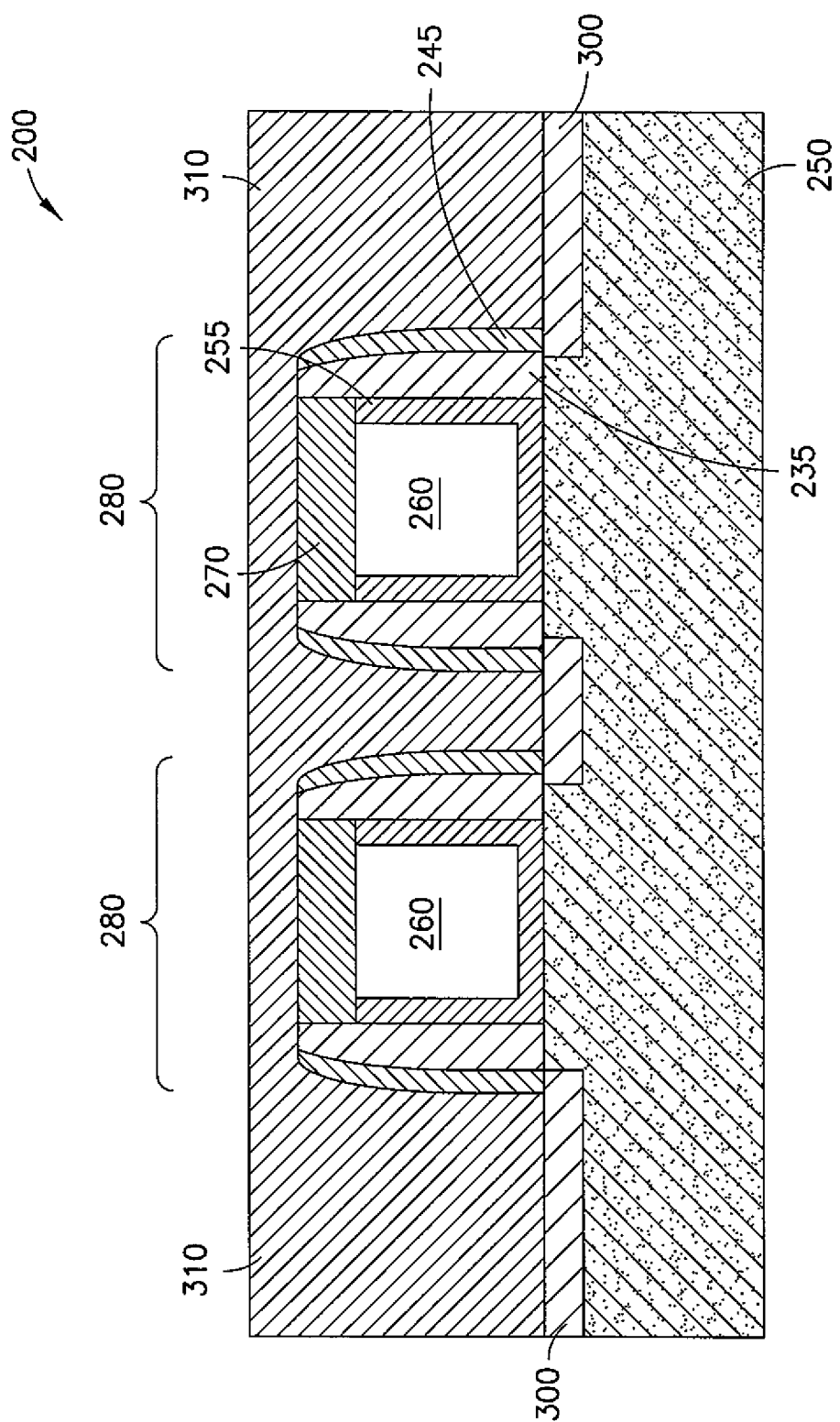

As shown in FIG. 6, a final ILD 310 is deposited over the RMGs 280 and the exposed silicided areas 300. A CMP or other planarization process is performed on the final ILD 310.

Figure 7:
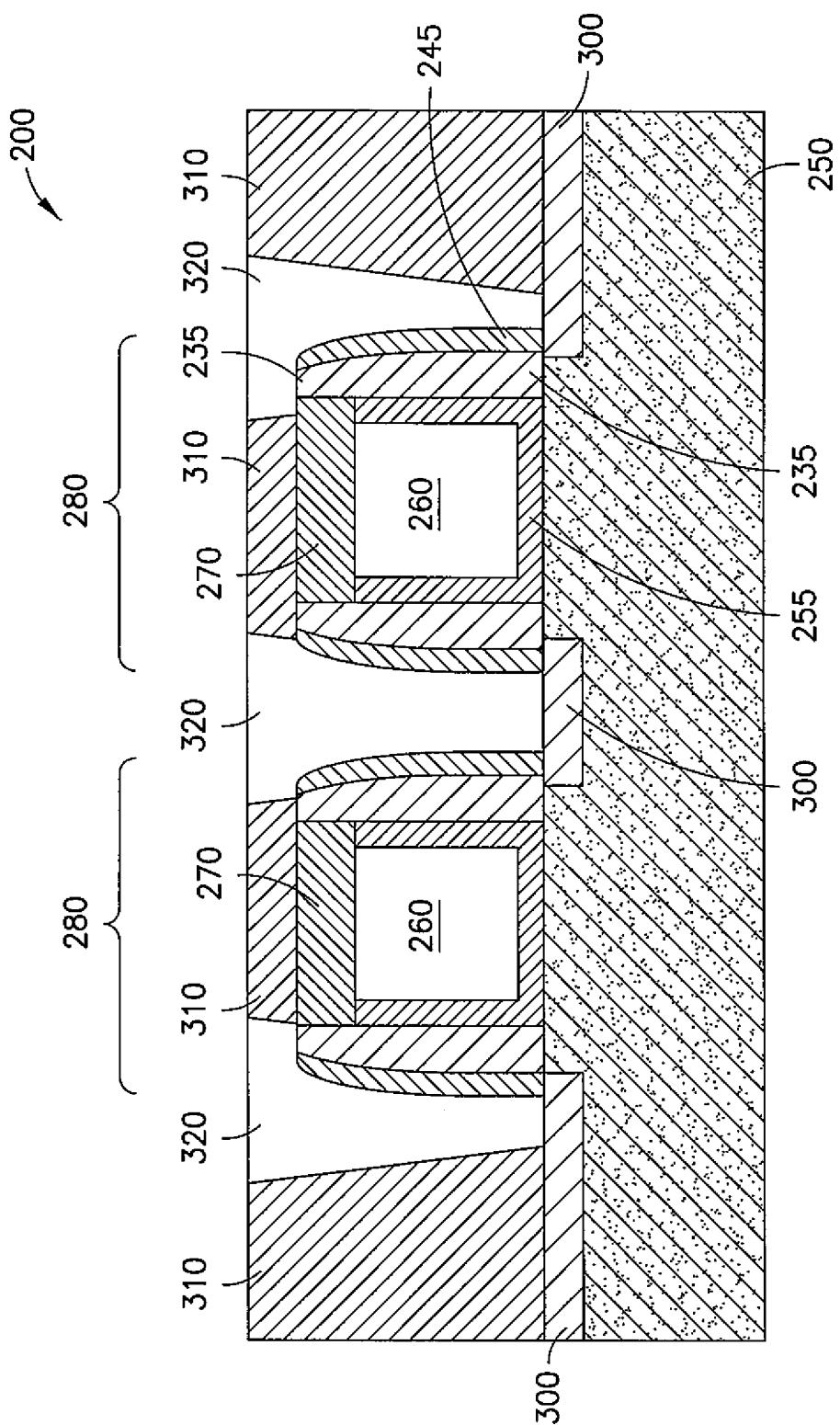

As shown in FIG. 7, vias are formed in the final ILD 310 to the silicided areas 300 adjacent to the RMGs 280 using lithography and etching techniques, thereby forming the SAC module 200 for receiving the self-aligned contacts. The vias provide the SAC module 200 with openings for the SACs 320. After formation of the vias, a CA metallization process is carried out on surfaces defining the vias.

In the exemplary process flow shown in FIGS. 2-7, the silicidation of the substrate 250 to form the silicided areas 300 is independent of the overlap of the SAC 320 to the spacers 235, 240. More specifically, there is little or no underlap of the silicided areas 300 with the spacers 235, 240, which results in more contact area between the SACs 320 and the silicided areas 300, which in turn results in less contact resistance. Furthermore, in such a configuration, more uniform contact resistance from device to device may be realized.

The exemplary embodiments, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise utilizing the exemplary embodiments of the methods described herein.

Based on the foregoing, it should be apparent that various exemplary embodiments provide methods for the fabrication of semiconductor devices by controlling the formation of source/drain regions, etching processes, deposition processes, silicidation, and polishing operations.

Figure 8:
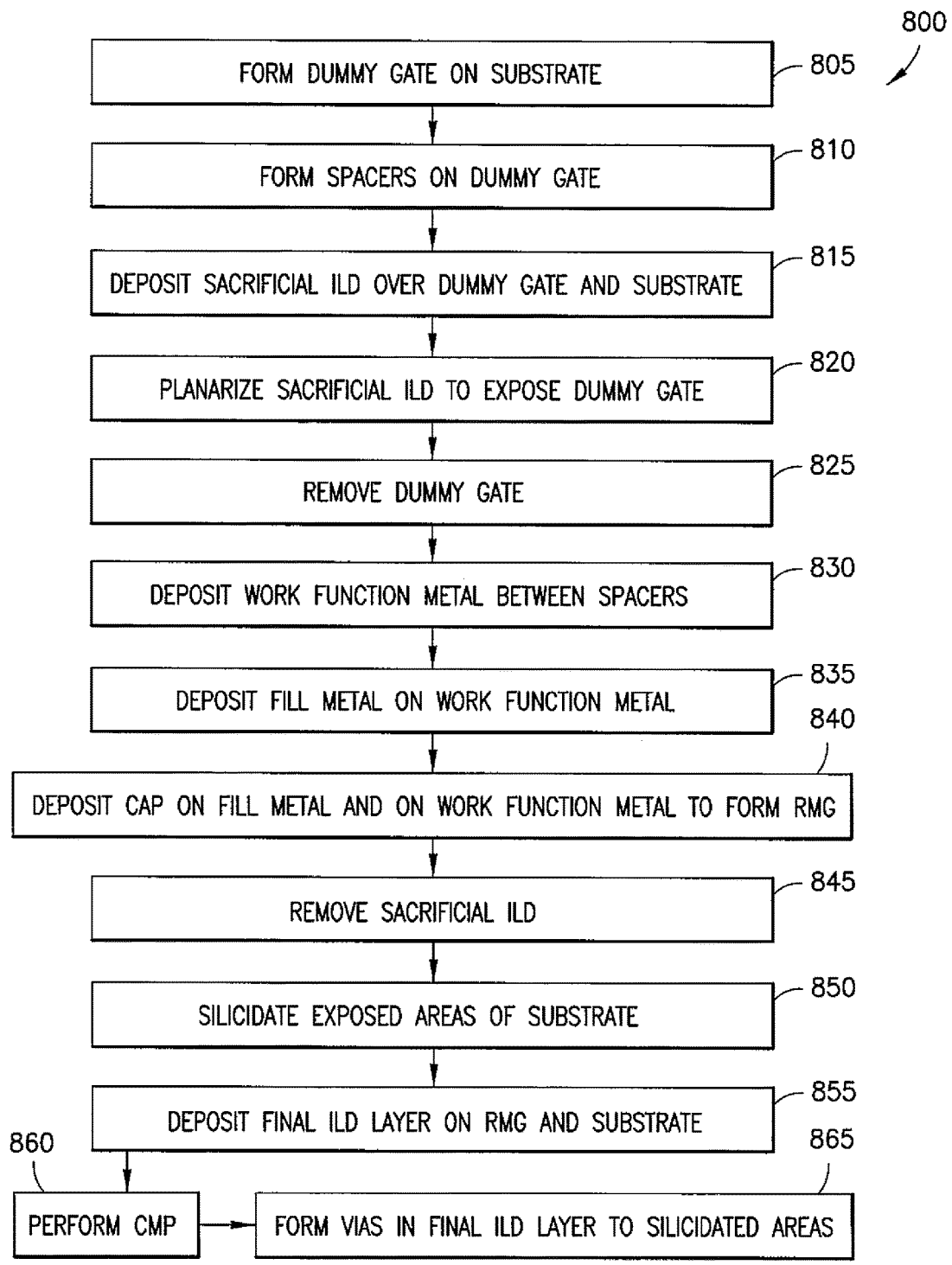
FIG. 8 is a logic flow diagram that illustrates the operation of one exemplary method, and a result of execution of computer program instructions embodied on a computer readable memory, in accordance with an exemplary embodiment of fabricating a semiconductor device with self-aligned contacts integrated with a replacement metal gate.

FIG. 8 is a logic flow diagram that illustrates the operation of one exemplary embodiment of a method 800 for the fabrication of a structure with self-aligned contacts integrated with a replacement metal gate. In the method 800, a dummy gate is formed on a substrate, as indicated at 805. Spacers are formed on the dummy gate, as indicated at 810, and a sacrificial ILD is deposited over the dummy gate and the substrate at 815. At 820, the sacrificial ILD is planarized to expose the dummy gate. At 825, the dummy gate is removed, and at 830 a work function metal is deposited between the spacers. At 835, a fill metal is deposited on the work function metal. A cap is deposited on the fill metal and the work function metal to form the RMG at 840. At 845, the sacrificial ILD is removed. At 850, the exposed areas of the substrate are silicided. A final ILD is then deposited on the RMG and the substrate at 855. Another planarization process (e.g., CMP process) is performed on the final ILD at 860. At 865, vias for the accommodation of the SAC are then formed in the final ILD, the vias extending from the surface of the polished ILD to the silicided areas.

Figure 9:
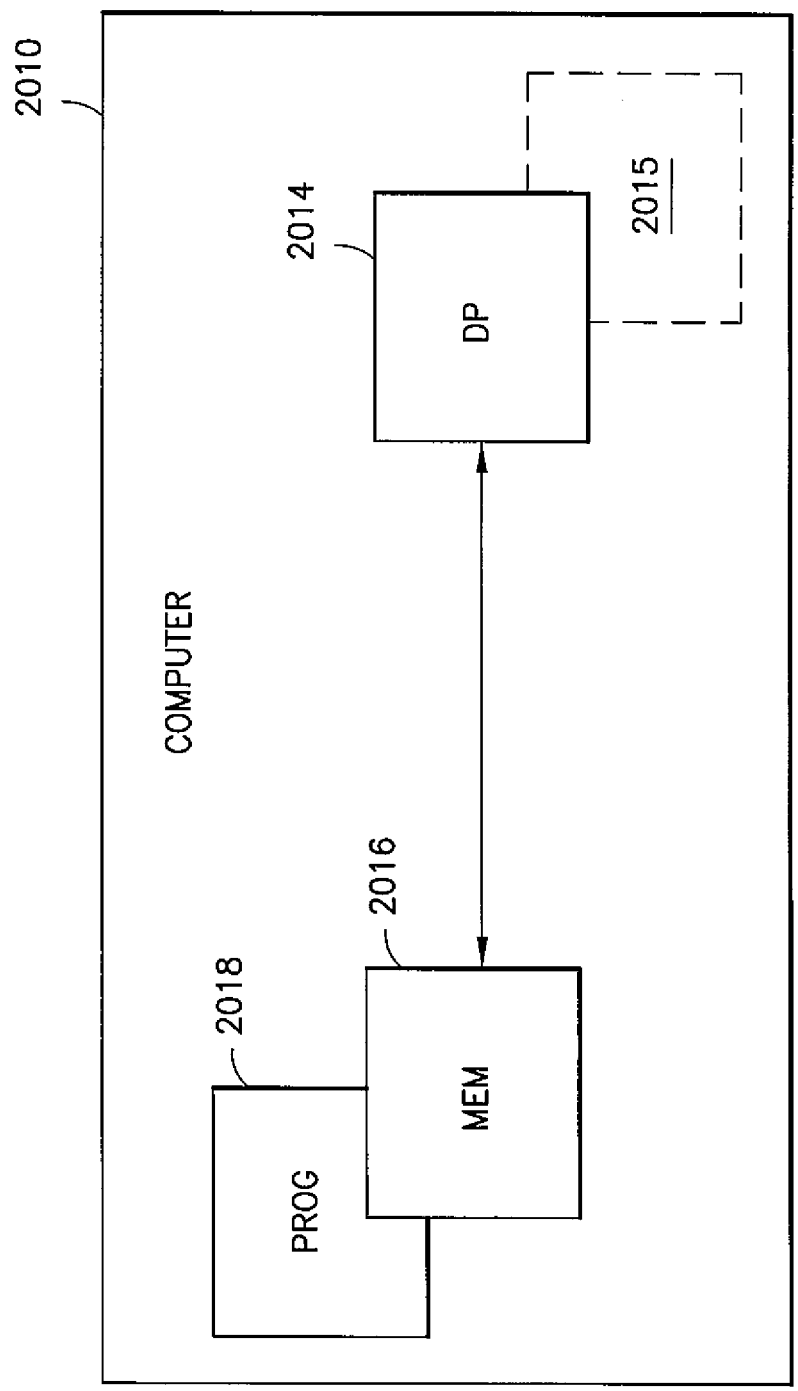
FIG. 9 is a block diagram of various electronic devices and apparatuses that may be suitable for use in fabricating a semiconductor device with self-aligned contacts integrated with a replacement metal gate.

Referring now to FIG. 9, a simplified block diagram of various electronic devices and apparatuses that are suitable for use in practicing the exemplary embodiments described herein is shown. For example, a computer 2010 may be used to control one or more of the processes as described above. The computer 2010 includes a controller, such as a computer or a data processor (DP) 2014 and a computer-readable memory medium embodied as a memory (MEM) 2016 that stores a program of computer instructions (PROG) 2018.

The PROG 2018 includes program instructions that, when executed by the associated DP 2014, enable the various electronic devices and apparatuses to operate in accordance with exemplary embodiments. That is, various exemplary embodiments may be implemented at least in part by computer software executable by the DP 2014 of the computer 2010, or by hardware, or by a combination of software and hardware (and firmware).

The computer 2010 may also include dedicated processors, for example a processor 2015 that controls the deposition, etching, lithography, silicidation, polishing, and/or metallization processes.

The computer readable MEM 2016 may be of any type suitable to the local technical environment and may be implemented using any suitable data storage technology, such as semiconductor based memory devices, flash memory, magnetic memory devices and systems, optical memory devices and systems, fixed memory, and removable memory. The DP 2014 may be of any type suitable to the local technical environment, and may include one or more of general purpose computers, special purpose computers, microprocessors, digital signal processors (DSPs), and processors based on a multicore processor architecture, as non-limiting examples.

The exemplary embodiments, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise utilizing the exemplary embodiments of the methods described herein.

In one exemplary aspect, an apparatus comprises a semiconductor device located on a substrate, the semiconductor device having a replacement metal gate and a first set of spacers adjacent to the replacement metal gate and on opposing sides of the replacement metal gate; at least one silicided area on the substrate and adjacent to at least one of the spacers of the first set of spacers; and a self-aligned contact disposed over the replacement metal gate of the semiconductor device and in contact with the silicided area. The at least one silicided area does not underlap the at least one spacer of the first set of spacers.

In the apparatus, a second set of spacers may be adjacent to the first spacer, the second set of spacers comprising spacers that correspond to and protect the spacers of the first set of spacers, and the at least one silicided area not underlapping the spacers of the second set of spacers. The replacement metal gate may comprise a work function metal disposed between the first set of spacers and on the substrate, a fill metal disposed on the work function metal, and a cap disposed on the work function metal and the fill metal and between the spacers. The self-aligned contact disposed over the replacement metal gate of the semiconductor device may be in contact with the silicided area through a metallized via. The work function metal may comprise titanium, titanium nitride, tantalum, tantalum nitride, ruthenium, or alloys of any of the foregoing materials. The fill metal may comprise aluminum, tungsten, copper, cobalt, nickel, tantalum, tantalum nitride, titanium, titanium nitride, TiAl alloy, ruthenium, tungsten, or alloys of any of the foregoing materials. A silicide used to form the silicided area may comprise cobalt, nickel, platinum, or titanium.

In another exemplary aspect, a method for fabricating a semiconductor device comprises forming a dummy gate on a substrate; forming spacers at opposing sides of the dummy gate; depositing a sacrificial interlayer dielectric over the dummy gate; planarizing the interlayer dielectric to expose the dummy gate; removing the dummy gate; forming a replacement metal gate with a protective cap between the spacers and on the substrate to replace the removed dummy gate; removing the sacrificial interlayer dielectric; siliciding exposed areas of the substrate adjacent to the replacement metal gate; depositing a final interlayer dielectric over the replacement metal gate and the exposed silicided areas; and forming vies through the final interlayer dielectric to the silicided areas.

Forming a replacement metal gate may comprise depositing a work function metal between the spacers and on the substrate, depositing a fill metal on the work function metal, and depositing a cap on the work function metal and the fill metal and between the spacers. Siliciding exposed areas of the substrate adjacent to the replacement metal gate may comprise using e-beam vaporization of a metal. Siliciding exposed areas of the substrate adjacent to the replacement metal gate may result in no underlap of the silicided areas with the spacers. Siliciding exposed areas of the substrate adjacent to the replacement metal gate may be self-aligned silicidation.

In another exemplary aspect, a method of forming a module for a self-aligned contact for a semiconductor device comprises sealing a dummy gate formed on a substrate by depositing a sacrificial interlayer dielectric over the dummy gate and the substrate; planarizing to reveal the dummy gate; replacing the dummy gate with a replacement metal gate with a protective cap; removing the sacrificial interlayer dielectric; siliciding areas of the substrate adjacent to the replacement metal gate; depositing a final interlayer dielectric over the silicided areas; and forming vias through the final interlayer dielectric to the silicided areas.

Sealing a dummy gate formed on a substrate may comprise depositing a sacrificial interlayer dielectric by chemical vapor deposition or atomic layer deposition. Removing the sacrificial interlayer dielectric may comprise stripping the sacrificial interlayer dielectric using at least one of a dry etch process and a wet etch process. Siliciding areas of the substrate adjacent to the replacement metal gate may comprise using a self-aligned silicidation process to form silicided areas on the substrate adjacent to the replacement metal gate. Using a self-aligned silicidation process to form silicided areas on the substrate adjacent to the replacement metal gate may result in no underlap of the silicided areas with the replacement metal gate.

The foregoing description has provided by way of exemplary and non-limiting examples a full and informative description of the best method and apparatus presently contemplated by the inventors for carrying out various exemplary embodiments. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments.

Furthermore, some of the features of the preferred embodiments could be used to advantage without the corresponding use of other features. As such, the foregoing description should be considered as merely illustrative of the principles, and not in limitation thereof.

What is claimed is:

1. An apparatus, comprising:
    a semiconductor device located on a substrate, the semiconductor device having a replacement metal gate and a first set of spacers adjacent to the replacement metal gate and on opposing sides of the replacement metal gate and a second set of spacers adjacent to the first set of spacers, the second set of spacers comprising spacers that correspond to and protect the spacers of the first set of spacers;
    at least one silicided area on the substrate and adjacent to at least one of the spacers of the first set of spacers; and
    a self-aligned contact disposed over the replacement metal gate of the semiconductor device and in contact with the silicided area;
    wherein the at least one silicided area does not underlap the at least one spacer of the first set of spacers; and
    wherein the at least one silicided area does not underlap the spacers of the second set of spacers.

2. The apparatus of claim 1, wherein the replacement metal gate comprises,
    a work function metal disposed between the first set of spacers and on the substrate,
    a fill metal disposed on the work function metal, and
    a cap disposed on the work function metal and the fill metal and between the spacers.

3. The apparatus of claim 1, wherein the self-aligned contact disposed over the replacement metal gate of the semiconductor device is in contact with the silicided area through a metallized via.

4. The apparatus of claim 1, wherein the work function metal comprises titanium, titanium nitride, tantalum, tantalum nitride, ruthenium, or alloys of any of the foregoing materials.

5. The apparatus of claim 1, wherein the fill metal comprises aluminum, tungsten, cobalt, nickel, tantalum, tantalum nitride, titanium, titanium nitride, TiAl alloy, ruthenium, tungsten, copper, or alloys of any of the foregoing materials.

6. The apparatus of claim 1, wherein a silicide used to form the silicided area comprises nickel, platinum, cobalt or titanium.

7. A method for fabricating a semiconductor device, comprising:
    forming a dummy gate on a substrate;
    forming a first set of spacers at opposing sides of the dummy gate;
    forming a second set of spacers on the first set of spacers;
    depositing a sacrificial interlayer dielectric over the dummy gate and the substrate;
    planarizing the interlayer dielectric to expose the dummy gate;
    removing the dummy gate;
    forming a replacement metal gate between the spacers of the first set of spacers and on the substrate to replace the removed dummy gate;
    removing the sacrificial interlayer dielectric;
    siliciding exposed areas of the substrate adjacent to the replacement metal gate;
    depositing a final interlayer dielectric over the replacement metal gate and the exposed silicided areas; and
    forming vias through the final interlayer dielectric to contact the silicided areas;
    wherein siliciding exposed areas of the substrate adjacent to the replacement metal gate results in no underlap of the silicided areas with the spacers of the first and second sets of spacers.

8. The method of claim 7, wherein forming a replacement metal gate comprises,
    depositing a work function metal between the spacers of the first set of spacers and on the substrate,
    depositing a fill metal on the work function metal, and
    depositing a cap on the work function metal and the fill metal and between the spacers of the first set of spacers.

9. The method of claim 7, wherein siliciding exposed areas of the substrate adjacent to the replacement metal gate comprises using e-beam vaporization of a metal.

10. The method of claim 7, wherein siliciding exposed areas of the substrate adjacent to the replacement metal gate is self-aligned silicidation.

11. A method of forming a module for a self-aligned contact for a semiconductor device, the method comprising:
    forming a first set of spacers on opposing sides of a dummy gate formed on a substrate;
    forming a second set of spacers on the spacers of the first set of spacers;
    sealing the dummy gate and the first and second sets of spacers by depositing a sacrificial interlayer dielectric over the dummy gate, the first and second sets of spacers, and the substrate;
    planarizing to reveal the dummy gate;
    replacing the dummy gate with a replacement metal gate with a protective cap;
    removing the sacrificial interlayer dielectric;
    siliciding areas of the substrate adjacent to the replacement metal gate using a self-aligned silicidation process to form silicided areas on the substrate adjacent to the replacement metal gate such that there is no underlap of the silicided areas with the first and second sets of spacers;

depositing a final interlayer dielectric over the silicided areas; and forming vias through the final interlayer dielectric to the silicided areas.

12. The method of claim 11, wherein sealing a dummy gate formed on a substrate comprises depositing a sacrificial interlayer dielectric by chemical vapor deposition or atomic layer deposition.

13. The method of claim 11, wherein removing the sacrificial interlayer dielectric comprises stripping the sacrificial interlayer dielectric using at least one of a dry etch process and a wet etch process.

* * * * *